(12) United States Patent
Takahashi et al.

(10) Patent No.: US 9,272,389 B2
(45) Date of Patent: Mar. 1, 2016

(54) POLISHING APPARATUS AND POLISHING METHOD

(71) Applicant: EBARA CORPORATION, Tokyo (JP)

(72) Inventors: Taro Takahashi, Tokyo (JP); Yuta Suzuki, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 14/527,714

(22) Filed: Oct. 29, 2014

(65) Prior Publication Data

US 2015/0125971 A1    May 7, 2015

(30) Foreign Application Priority Data

Nov. 1, 2013  (JP) .................................. 2013-228240

(51) Int. Cl.
| | |
|---|---|
| B24B 49/00 | (2012.01) |
| B24B 37/04 | (2012.01) |
| B24B 1/00 | (2006.01) |
| H01L 21/66 | (2006.01) |
| H01L 21/306 | (2006.01) |
| B24B 49/10 | (2006.01) |
| B24B 37/013 | (2012.01) |
| B24B 37/005 | (2012.01) |
| H01L 21/67 | (2006.01) |
| H01L 21/12 | (2006.01) |

(52) U.S. Cl.
CPC ............. *B24B 49/105* (2013.01); *B24B 37/005* (2013.01); *B24B 37/013* (2013.01); *B24B 37/042* (2013.01); *H01L 21/12* (2013.01); *H01L 21/67253* (2013.01); *H01L 22/26* (2013.01); *H01L 21/30625* (2013.01)

(58) Field of Classification Search
CPC ................................................ H01L 21/67253
USPC ........................................ 438/14, 15, 16, 5
See application file for complete search history.

(56) References Cited

U.S. PATENT DOCUMENTS

| | | | | |
|---|---|---|---|---|
| 5,876,265 | A | * | 3/1999 | Kojima ............................ 451/10 |
| 6,398,626 | B1 | * | 6/2002 | Matsuo et al. ................... 451/66 |
| 6,797,623 | B2 | * | 9/2004 | Sato et al. ...................... 438/691 |
| 6,878,038 | B2 | * | 4/2005 | Johansson et al. ................ 451/6 |
| 7,311,004 | B2 | * | 12/2007 | Giles ............................... 73/592 |
| 2004/0011462 | A1 | * | 1/2004 | Gotkis et al. ............. 156/345.13 |
| 2004/0176014 | A1 | * | 9/2004 | Bennett et al. .................... 451/5 |
| 2007/0103150 | A1 | | 5/2007 | Tada et al. |
| 2007/0239309 | A1 | * | 10/2007 | Tada .................... B24B 37/005 700/121 |
| 2010/0093260 | A1 | | 4/2010 | Kobayashi et al. |
| 2010/0120331 | A1 | * | 5/2010 | Carlsson et al. .................. 451/5 |

FOREIGN PATENT DOCUMENTS

| | | |
|---|---|---|
| JP | 2001-198813 | 7/2001 |
| JP | 2009-287930 | 12/2009 |
| JP | 2011-000647 | 1/2011 |

* cited by examiner

*Primary Examiner* — Victor A Mandala
*Assistant Examiner* — Regan J Rundio
(74) *Attorney, Agent, or Firm* — Baker & Hostetler LLP

(57) ABSTRACT

A polishing apparatus capable of monitoring an accurate progress of polishing is disclosed. The polishing apparatus includes: a polishing table for supporting a polishing pad; a table motor configured to rotate the polishing table; a top ring configured to press a substrate against the polishing pad to polish the substrate; a dresser configured to dress the polishing pad while oscillating on the polishing pad during polishing of the substrate; a filtering device configured to remove a vibration component, having a frequency corresponding to an oscillation period of the dresser, from an output current signal of the table motor; and a polishing monitoring device configured to monitor a progress of polishing of the substrate based on the output current signal from which the vibration component has been removed.

16 Claims, 7 Drawing Sheets

POLISHING APPARATUS AND POLISHING METHOD

CROSS REFERENCE TO RELATED APPLICATION

This document claims priority to Japanese Patent Application Number 2013-228240 filed Nov. 1, 2013, the entire contents of which are hereby incorporated by reference.

BACKGROUND OF THE INVENTION

A chemical mechanical polishing (CMP) apparatus is a typical apparatus for polishing a substrate, such as a wafer. This CMP apparatus is configured to supply a polishing liquid onto a polishing pad on a polishing table while rotating the polishing table, and press a wafer against the polishing pad to thereby bring the wafer into sliding contact with the polishing pad in the presence of the polishing liquid. A surface of the wafer is polished by a mechanical action of abrasive grains contained in the polishing liquid and a chemical action of chemical components contained in the polishing liquid.

The CMP apparatus typically includes a polishing-progress monitoring device in order to detect a polishing end point of the wafer. There are several types of polishing-progress monitoring devices, one of which is a table-current monitoring device that monitors a current value of a table motor for rotating the polishing table. This table-current monitoring device is configured to detect a progress of polishing of the wafer from a change in the current value of the table motor that is necessary for rotating the polishing table at a preset constant speed. The wafer typically has a multilayer structure composed of different kinds of films. When an uppermost film is removed by a polishing process, an underlying film is exposed. As a result, a frictional force between the wafer and the polishing pad changes. This change in the frictional force is reflected as the change in the current value of the table motor for rotating the polishing table. Therefore, the table-current monitoring device can detect a removal of the uppermost film from the change in the current value of the table motor.

In a case where the uppermost film of the wafer is a conductive film, a polishing-progress monitoring device having an eddy current sensor may be used. The eddy current sensor is configured to supply a high-frequency alternating current to a coil so as to induce an eddy current in a conductive film of the wafer, and detect a thickness of the conductive film from a change in impedance due to a magnetic field of the induced eddy current. The eddy current sensor is embedded in the polishing table, and obtains a film thickness signal while scanning a surface of the wafer each time the polishing table makes one revolution. The polishing-progress monitoring device can monitor the progress of polishing of the wafer from a change in the film thickness signal.

The wafer is polished while being pressed against the polishing pad in the presence of the polishing liquid. During polishing of the wafer, the abrasive grains in the polishing liquid are accumulated on a surface (i.e., polishing surface) of the polishing pad and minute surface irregularities of the polishing pad are crushed. As a result, a polishing performance of the polishing pad is lowered. Therefore, in order to restore the surface of the polishing pad, a dresser is used.

The dresser has a dressing surface which is constituted by minute diamond particles. The dresser presses the dressing surface against the polishing pad while rotating the dressing surface, and further oscillates along a radial direction of the polishing pad to thereby slightly scrape away the surface of the polishing pad. Thus, the surface (i.e., polishing surface) of the polishing pad is restored. Such a restoration of the polishing pad with use of the dresser is referred to as pad dressing or pad conditioning.

In a case where the above-described table-current monitoring device is used as the polishing-progress monitoring device, the pad dressing may be performed during polishing of the wafer. In this case, the progress of polishing is monitored based on the current value of the table motor while polishing the wafer. However, since the dresser oscillates on the polishing pad during polishing of the wafer, the current value of the table motor changes due to an influence of the oscillation of the dresser. Therefore, the polishing-progress monitoring device may fail to accurately monitor the progress of polishing.

Furthermore, the polishing-progress monitoring device using the eddy current sensor has a following problem caused by a wafer structure. Typically, a number of devices are regularly formed on the surface of the wafer to be polished, and metal structures, such as a metal film and metal interconnects, are present under the uppermost film to be polished. These metal structures are present in each device, and are regularly arranged in one wafer. When the eddy current sensor sweeps across the surface of such wafer, the film thickness signal varies due to an influence of an arrangement of the metal structures. Therefore, the polishing-progress monitoring device may fail to accurately monitor the progress of polishing.

SUMMARY OF THE INVENTION

According to embodiments described below, there are provided a polishing apparatus and a polishing method capable of monitoring an accurate progress of polishing.

The embodiments, which will be described below, relate a polishing apparatus and a polishing method for polishing a substrate, such as a wafer, and more particularly to a polishing apparatus and a polishing method for polishing a substrate while monitoring a progress of polishing.

In an embodiment, there is provided a polishing apparatus including: a polishing table for supporting a polishing pad; a table motor configured to rotate the polishing table; a top ring configured to press a substrate against the polishing pad to polish the substrate; a dresser configured to dress the polishing pad while oscillating on the polishing pad during polishing of the substrate; a filtering device configured to remove a vibration component, having a frequency corresponding to an oscillation period of the dresser, from an output current signal of the table motor; and a polishing monitoring device configured to monitor a progress of polishing of the substrate based on the output current signal from which the vibration component has been removed.

In an embodiment, there is provided a polishing apparatus including: a polishing table for supporting a polishing pad; a table motor configured to rotate the polishing table; a top ring configured to oscillate while pressing a substrate against the polishing pad; a filtering device configured to remove a vibration component, having a frequency corresponding to an oscillation period of the top ring, from an output current signal of the table motor; and a polishing monitoring device configured to monitor a progress of polishing of the substrate based on the output current signal from which the vibration component has been removed.

In an embodiment, there is provided a polishing apparatus including: a polishing table for supporting a polishing pad; a table motor configured to rotate the polishing table; a top ring configured to press a substrate against the polishing pad to polish the substrate; an eddy current sensor configured to scan a surface of the substrate to obtain a film thickness signal that varies according to a film thickness of the substrate; a filtering device configured to remove a vibration component, having a predetermined frequency, from the film thickness signal; and a polishing monitoring device configured to monitor a progress of polishing of the substrate based on the film thickness signal from which the vibration component has been removed.

In an embodiment, there is provided a polishing method including: rotating a polishing table by a table motor, pressing a substrate against a polishing pad on the polishing table to polish the substrate; oscillating a dresser on the polishing pad to dress the polishing pad during polishing of the substrate; removing a vibration component, having a frequency corresponding to an oscillation period of the dresser, from an output current signal of the table motor, and monitoring a progress of polishing of the substrate based on the output current signal from which the vibration component has been removed.

In an embodiment, there is provided a polishing method including: rotating a polishing table by a table motor, oscillating a top ring while the top ring is pressing a substrate against a polishing pad on the polishing table; removing a vibration component, having a frequency corresponding to an oscillation period of the top ring, from an output current signal of the table motor; and monitoring a progress of polishing of the substrate based on the output current signal from which the vibration component has been removed.

In an embodiment, there is provided a polishing method including: rotating a polishing table by a table motor; pressing a substrate against a polishing pad on the polishing table to polish the substrate; scanning a surface of the substrate with an eddy current sensor to obtain a film thickness signal that varies according to a film thickness of the substrate; removing a vibration component, having a predetermined frequency, from the film thickness signal; and monitoring a progress of polishing of the substrate based on the film thickness signal from which the vibration component has been removed.

According to the above-described embodiments, the vibration component due to the oscillation of the dresser is removed from the output current signal of the table motor. Therefore, the polishing monitoring device can accurately monitor the progress of polishing of the substrate based on the output current signal that does not contain the vibration component.

According to the above-described embodiments, the vibration component due to the oscillation of the top ring is removed from the output current signal of the table motor. Therefore, the polishing monitoring device can accurately monitor the progress of polishing of the substrate based on the output current signal that does not contain the vibration component.

According to the above-described embodiments, the vibration component due to a structure of the substrate is removed from the film thickness signal of the eddy current sensor. Therefore, the polishing monitoring device can accurately monitor the progress of polishing of the substrate based on the film thickness signal that does not contain the vibration component.

DETAILED DESCRIPTION OF THE PREFERRED EMBODIMENTS

Figure 1:
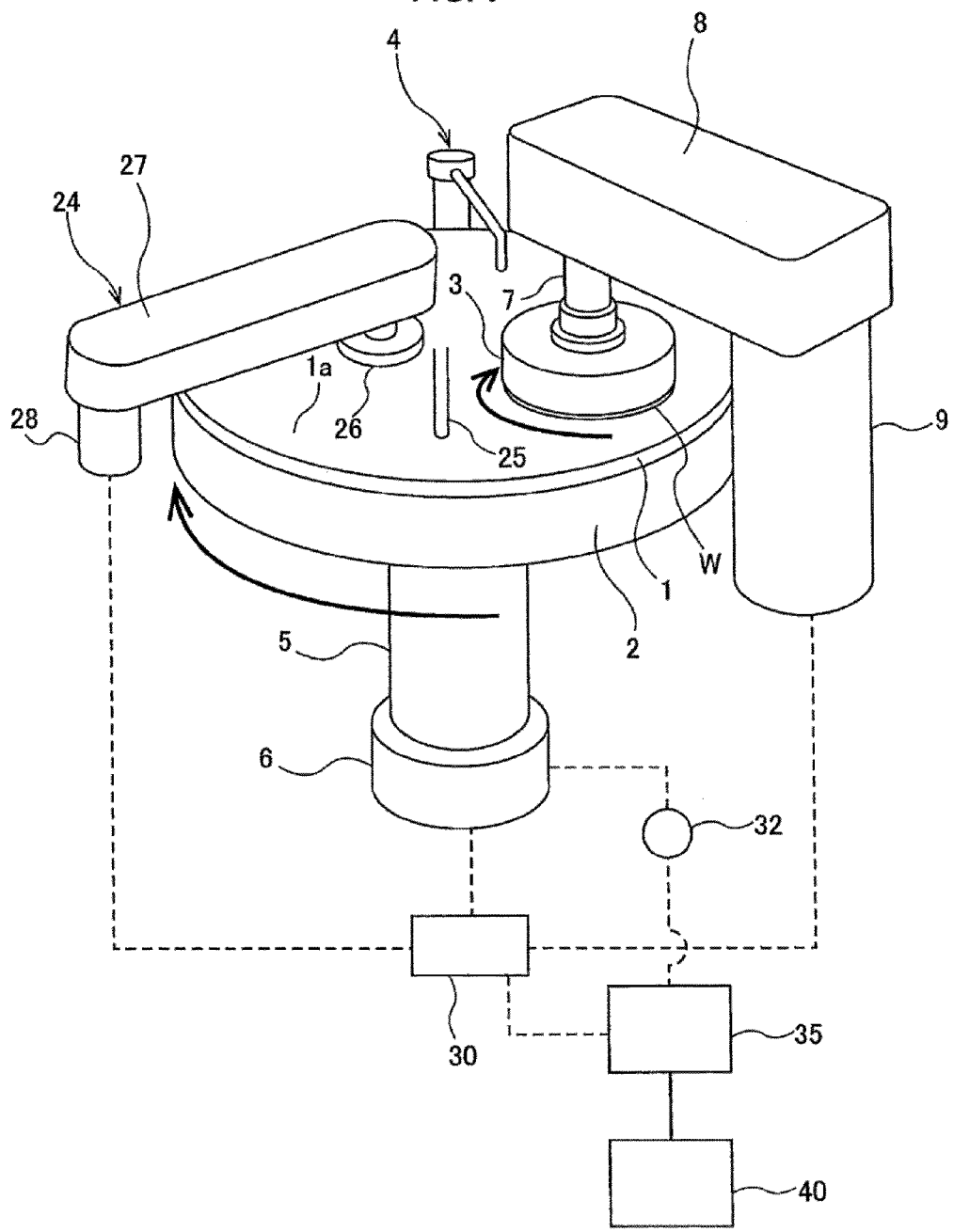
FIG. 1 is a perspective view of a polishing apparatus according to an embodiment.

Embodiments of the present invention will be described below with reference to the drawings. FIG. 1 is a perspective view of a polishing apparatus according to an embodiment. As shown in FIG. 1, the polishing apparatus includes a polishing table 2 for supporting a polishing pad 1, a top ring 3 for pressing a wafer W, which is a substrate, against the polishing pad 1, and a polishing liquid supply nozzle 4 for supplying a polishing liquid (slurry) onto the polishing pad 1.

The polishing table 2 is coupled via a table shaft 5 to a table motor 6 disposed below the polishing table 2, so that the polishing table 2 is rotated by the table motor 6 in a direction indicated by arrow. The polishing pad 1 is attached to an upper surface of the polishing table 2. The polishing pad 1 has an upper surface, which provides a polishing surface 1a for polishing the wafer W. The top ring 3 is secured to a lower end of a top ring shaft 7. The top ring 3 is configured to be able to hold the wafer W on its lower surface by vacuum suction. The top ring shaft 7 is coupled to a rotating mechanism (not shown) disposed in a top ring arm 8, so that the top ring 3 is rotated by the rotating mechanism through the top ring shaft 7.

The top ring shaft 7 can be elevated and lowered by an elevating mechanism (not shown). The top ring arm 8 is configured to be able to pivot about a top ring pivot shaft 9. With a pivoting motion of this top ring arm 8, the top ring 3 moves between a polishing position above the polishing table 2 and a wafer transfer position (or a substrate transfer position) outside the polishing table 2.

Polishing of the wafer W is performed as follows. The top ring 3 and the polishing table 2 are rotated, respectively, while the polishing liquid (slurry) is supplied onto the polishing pad 1 from the polishing liquid supply nozzle 4. In this state, the top ring 3 presses the wafer W against the upper surface (i.e., polishing surface) 1a of the polishing pad 1. The surface of the wafer W is polished by a mechanical action of abrasive grains contained in the polishing liquid and a chemical action of the polishing liquid.

The polishing apparatus further includes a dressing unit 24 for dressing the polishing surface 1a of the polishing pad 1. The dressing unit 24 includes a dresser 26 configured to be brought into sliding contact with the polishing surface 1a of the polishing pad 1, a dresser arm 27 that supports the dresser 26, and a dresser pivot shaft 28 configured to cause the dresser arm 27 to pivot. With a pivoting motion of the dresser arm 27, the dresser 26 oscillates on the polishing surface 1a in a radial direction of the polishing pad 1. A lower surface of the dresser 26 provides a dressing surface, which is constituted by a large number of abrasive grains, such as diamond particles.

The dresser 26 oscillates on the polishing surface 1a in the radial direction of the polishing pad 1 while rotating about its own axis to thereby bring its the dressing surface into sliding contact with the polishing pad 1. The surface of the polishing pad 1 is slightly scraped away by the dresser 26, so that the polishing surface 1a of the polishing pad 1 is dressed. During dressing of the polishing pad 1, pure water is supplied from a pure water supply nozzle 25 onto the polishing surface 1a of the polishing pad 1.

Operations of the polishing table 2, the top ring 3, the dressing unit 24, the polishing liquid supply nozzle 4, the pure water supply nozzle 25 and other components are controlled by an operation controller 30.

Since the surface of the wafer W and the polishing surface 1a of the polishing pad 1 are brought into sliding contact with each other during polishing of the wafer W, a frictional force is generated between the wafer W and the polishing pad 1. This frictional force varies depending on a shape of an exposed surface of the wafer W and a type of film that forms the exposed surface. For example, when an upper film is removed by the polishing process, and, as a result, a lower film is exposed, the frictional force generated between the wafer W and the polishing pad 1 changes.

The table motor 6 is controlled so as to rotate the polishing table 2 at a preset constant speed. Therefore, when the frictional force acting between the wafer W and the polishing pad 1 changes, an electric current, i.e., a torque current, flowing into the table motor 6 also changes. More specifically, when the frictional force increases, the torque current increases so as to exert a greater torque on the polishing table 2. When the frictional force decreases, the torque current decreases so as to exert a smaller torque on the polishing table 2. Therefore, it is possible to detect a removal of an uppermost layer from the change in the electric current flowing into the table motor 6.

Figure 2:
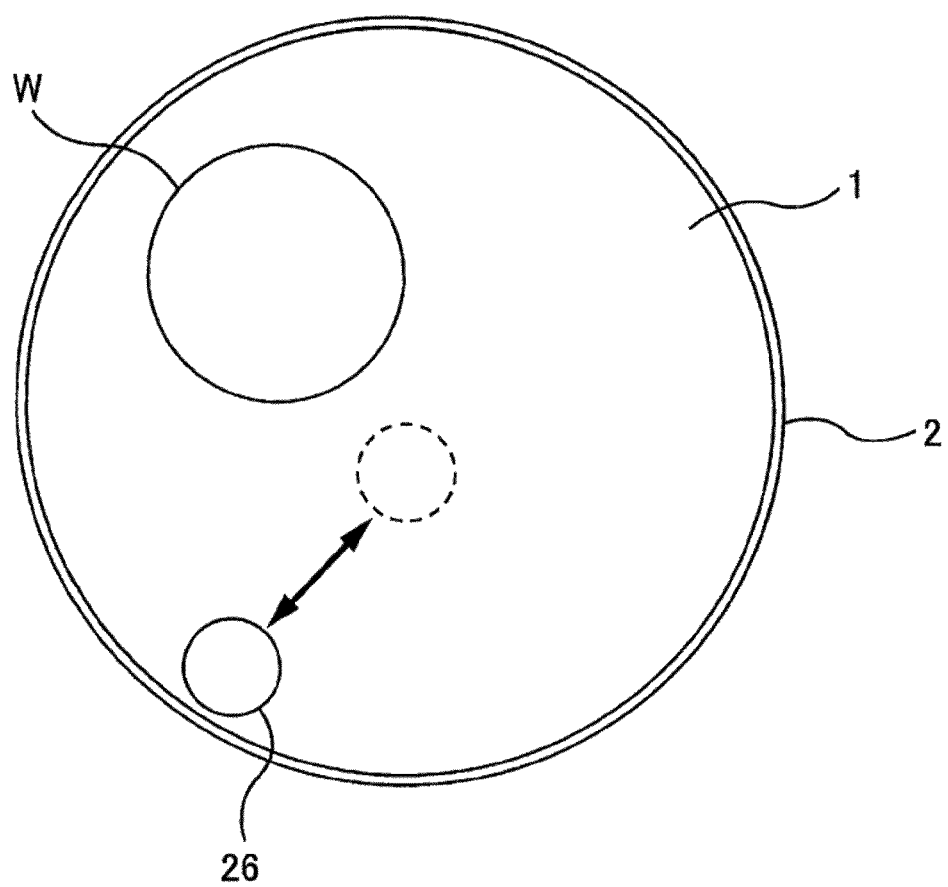
FIG. 2 is a plan view schematically showing a wafer and a dresser on a polishing pad.
Figure 3:
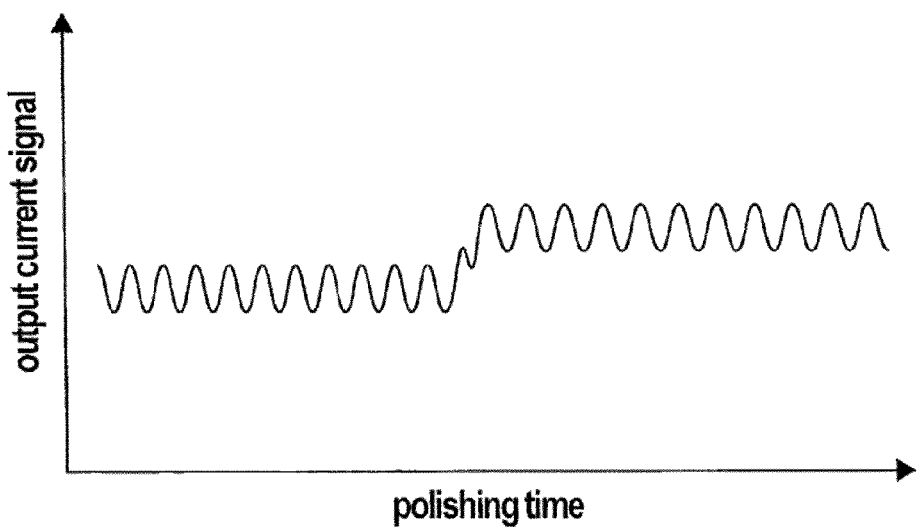
FIG. 3 is a graph showing current value of a table motor.

FIG. 2 is a plan view schematically showing the wafer W and the dresser 26 on the polishing pad 1. In this embodiment, dressing of the polishing pad 1 is performed when polishing of the wafer W is being performed. More specifically, the wafer W is pressed against the rotating polishing pad 1, while the dresser 26 oscillates on the polishing pad 1 in the radial direction of the polishing pad 1. The oscillation of the dresser 26 causes the current value of the table motor 6 to vibrate with a very short period, as shown in FIG. 3. Such a vibration inhibits an accurate detection of the progress of polishing of the wafer W. Therefore, the polishing apparatus according to the embodiment has a filtering device 35 for removing a vibration component, generated due to the oscillation of the dresser 26, from an output current signal indicating the electric current flowing into the table motor 6.

As shown in FIG. 1, an ammeter 32 for measuring the electric current flowing into the table motor 6 is coupled to the table motor 6, and the filtering device 35 is coupled to the ammeter 32. This filtering device 35 is configured to obtain the output current signal, which indicates the electric current when the table motor 6 rotates the polishing table 2, from the ammeter 32, and remove the vibration component from this output current signal. The output current signal indicates a value of the electric current flowing into the table motor 6. The filtering device 35 may be coupled to, instead of the table motor 6, an inverter (not shown) for driving the table motor 6. In this case, the filtering device 35 can obtain the output current signal, which indicates the electric current when the table motor 6 rotates the polishing table 2, from the inverter.

The filtering device 35 is coupled to the operation controller 30. Since the vibration component contained in the output current signal is caused by the oscillation of the dresser 26, the period of the vibration component corresponds to an oscillation period of the dresser 26. Thus, the filtering device 35 obtains the oscillation period of the dresser 26 from the operation controller 30, calculates a frequency corresponding to the oscillation period of the dresser 26, and removes the vibration component, having the calculated frequency, from the output current signal of the table motor 6. The frequency corresponding to the oscillation period of the dresser 26 can be calculated with use of a known formula $f\,[Hz]=1/T\,[s]$.

Figure 4:
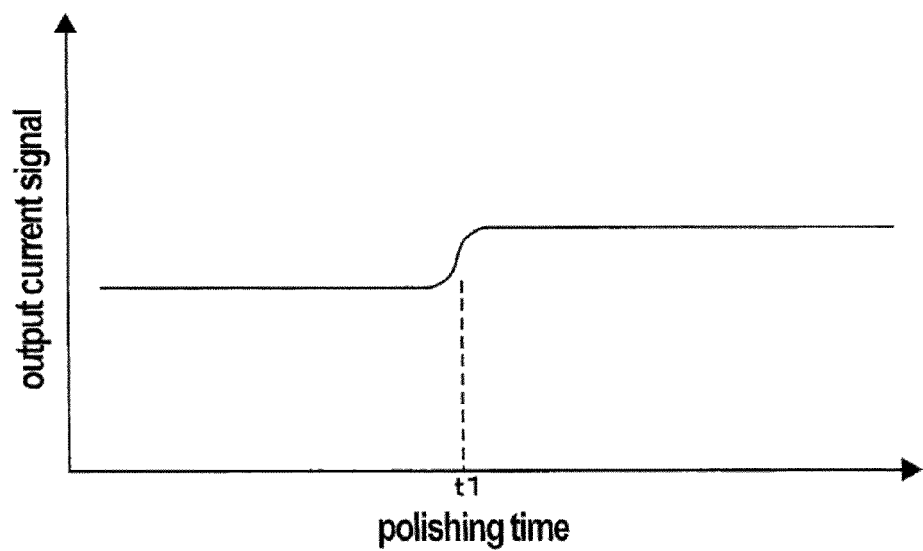
FIG. 4 is a graph showing an output current signal from which a vibration component has been removed.

A polishing monitoring device 40, which is configured to monitor the progress of polishing of the wafer W based on the output current signal from which the vibration component has been removed, is coupled to the filtering device 35. FIG. 4 is a graph showing the output current signal from which the vibration component has been removed. As can be seen from FIG. 4, the output current signal, from which the vibration component has been removed, clearly indicates a point t1 of change in the electric current flowing into the table motor 6. Therefore, the polishing monitoring device 40 can accurately detect the point t1 at which the output current signal changes, i.e., at which the uppermost film is removed.

During polishing of the wafer W, the top ring 3 may oscillate around the top ring pivot shaft 9 in a horizontal direction while pressing the wafer W against polishing pad 1. In this case, the filtering device 35 obtains an oscillation period of the top ring 3 from the operation controller 30, calculates a frequency corresponding to the oscillation period of the top ring 3, and removes a vibration component, having the calculated frequency, from the output current signal of the table motor 6. During polishing of the wafer W, both of the top ring 3 and the dresser 26 may oscillate. In this case, the filtering device 35 removes the vibration component having the frequency corresponding to the oscillation period of the top ring 3 and the vibration component having the frequency corresponding to the oscillation period of the dresser 26 from the output current signal of the table motor 6.

Figure 5:
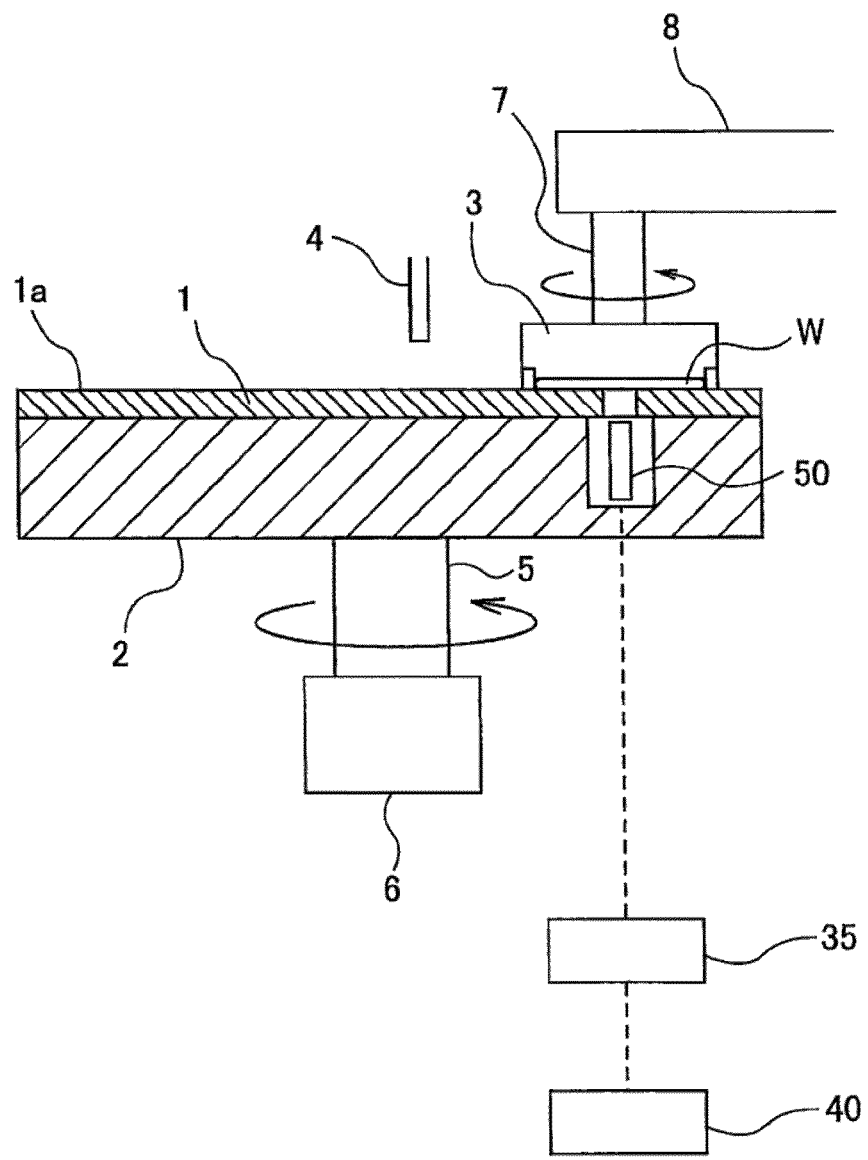
FIG. 5 is a cross-sectional view schematically showing the polishing apparatus according to another embodiment.

In a case where the uppermost film of the wafer is a conductive film, an eddy current sensor may be used for monitoring the progress of polishing of the wafer. FIG. 5 is a cross-sectional view schematically showing the polishing apparatus according to another embodiment. In FIG. 5, the dressing unit 24 is omitted. Structures, which will not be described particularly, are identical to those of the embodiment shown in FIG. 1. As shown in FIG. 5, an eddy current sensor 50 is embedded in the polishing table 2. This eddy current sensor 50 is configured to supply a high-frequency alternating current to a coil so as to induce an eddy current in the conductive film of the wafer W, and detect a thickness of the conductive film from a change in impedance due to a magnetic field of the induced eddy current.

In this embodiment, dressing of the polishing pad 1 is not performed during polishing of the wafer W. The eddy current sensor 50 obtains a film thickness signal while scanning the surface of the wafer W each time the polishing table 2 makes one revolution. This film thickness signal varies according to a change in the thickness of the conductive film of the wafer W. Therefore, the polishing monitoring device 40 monitors the progress of polishing of the wafer W based on this film thickness signal. For example, the polishing monitoring device 40 can determine a polishing end point at which the film thickness signal reaches a predetermined threshold value.

Figure 6:
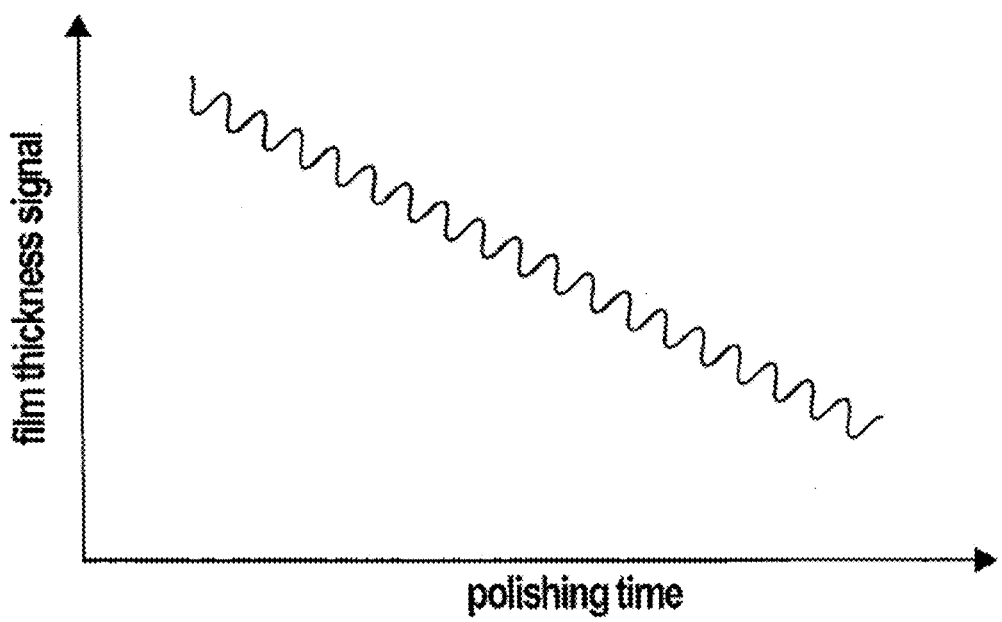
FIG. 6 is a graph showing a film thickness signal of an eddy current sensor.

Typically, the wafer W to be polished has a surface on which a number of devices are regularly formed. Metal structures, such as a metal film and metal interconnects, are present under the uppermost film to be polished. The metal structures, lying in this lower layer, are present in each of the devices, and are regularly arranged in one wafer W. When the eddy current sensor 50 scans the surface of such wafer W, the film thickness signal of the eddy current sensor 50 varies due to an influence of the arrangement of the metal structures lying in the lower layer, as shown in FIG. 6. As a result, it may not be possible to accurately monitor the progress of polishing.

Therefore, as with the above-described embodiment, the polishing apparatus has the filtering device 35 for removing a vibration component, generated due to the device structure of the wafer W, from the film thickness signal of the eddy current sensor 50. As shown in FIG. 5, the filtering device 35 is coupled to the eddy current sensor 50. This filtering device 35 is configured to remove the vibration component from the film thickness signal that is outputted from the eddy current sensor 50.

A frequency of the vibration component to be removed is preset in the filtering device 35. The frequency of this vibration component is determined in advance based on the device structure of the wafer W, a rotational speed of the polishing table 2, and other factor, and is inputted in advance into the filtering device 35. The filtering device 35 removes the vibration component, having the above-described frequency, from the film thickness signal of the eddy current sensor 50.

Figure 7:
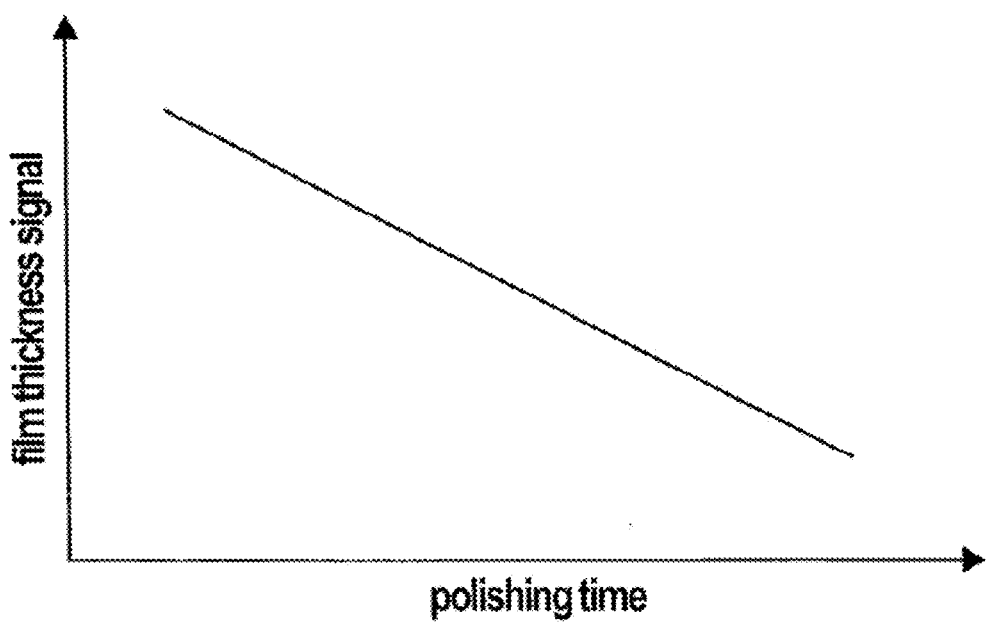
FIG. 7 is a graph showing a film thickness signal from which a vibration component has been removed.

The polishing monitoring device 40, which is configured to monitor the progress of polishing of the wafer W based on the film thickness signal from which the vibration component has been removed, is coupled to the filtering device 35. FIG. 7 is a graph showing the film thickness signal from which the vibration component has been removed. The polishing monitoring device 40 can accurately monitor the polishing of the wafer W based on the film thickness signal from which the vibration component has been removed. For example, the polishing monitoring device 40 determines a polishing end point at which the film thickness signal reaches a predetermined threshold value.

Figure 8:
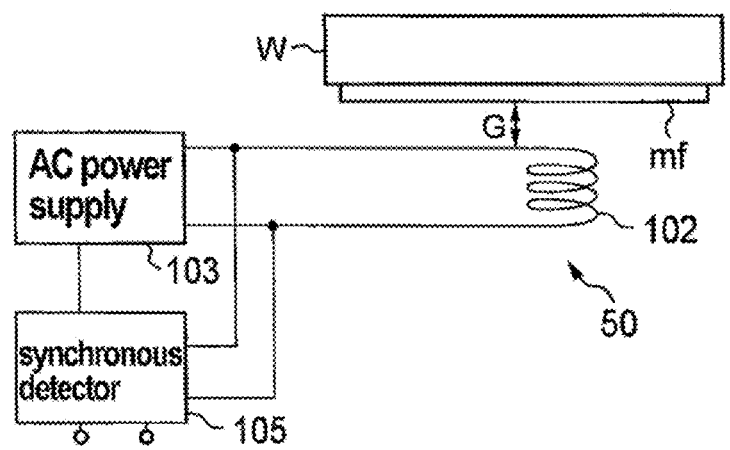
FIG. 8 is a schematic view showing the eddy current sensor.

Next, the eddy current sensor 50 will be described in more detail. FIG. 8 is a schematic view showing the eddy current sensor 50. This eddy current sensor 50 includes a sensor coil 102, an AC power supply 103 coupled to this sensor coil 102, and a synchronous detector 105 configured to detect a resistance component X and an inductive reactance component Y of an electric circuit including the sensor coil 102. A conductive film mf is, for example, a thin film which is made of a conductive material, such as copper, tungsten, tantalum, or titanium, formed on the wafer W. A distance G between the sensor coil 102 and the conductive film mf is set in a range of 0.5 mm to 5 mm, for example.

Figure 9:
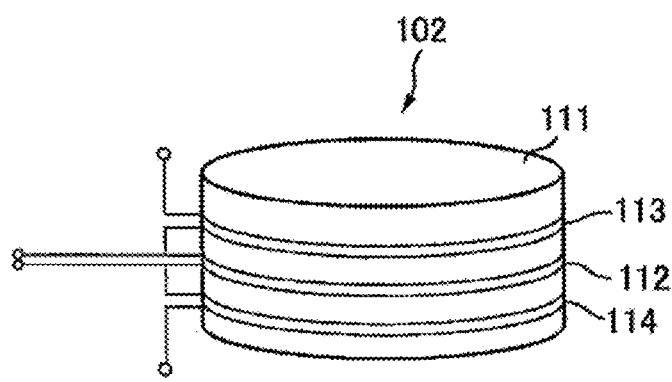
FIG. 9 is a view showing a structural example of a sensor coil in the eddy current sensor shown in FIG. 8.

FIG. 9 shows a structural example of the sensor coil 102 in the eddy current sensor 50 shown in FIG. 8. The sensor coil 102 is constructed by three coils 112, 113, and 114 wound on a bobbin 111, these coils 112, 113, and 114 forming a three-layer coil. The center coil 112 is an exciting coil coupled to the AC power supply 103. This exciting coil 112 produces a magnetic field by an alternating current supplied from the AC power supply 103 to thereby induce the eddy current in the conductive film on the wafer. The detection coil 113 is located above the exciting coil 112 (i.e., located at the conductive-film side), and is configured to detect a magnetic flux generated by the eddy current flowing in the conductive film. The balance coil 114 is located at an opposite side of the detection coil 113.

The coils 113 and 114 preferably have the same number of turns (1 to 500 turns), while the number of turns of the coil 112 is not limited particularly. The detection coil 113 and the balance coil 114 are coupled in opposite phase to each other. When the conductive film is present near the detection coil 113, the magnetic flux produced by the eddy current generated in the conductive film is interlinked with the detection coil 113 and the balance coil 114. Since the detection coil 113 is located closer to the conductive film than the balance coil 114, voltages induced in the coils 113 and 114 become unbalanced, whereby the interlinkage flux generated by the eddy current in the conductive film can be detected.

Figure 10:
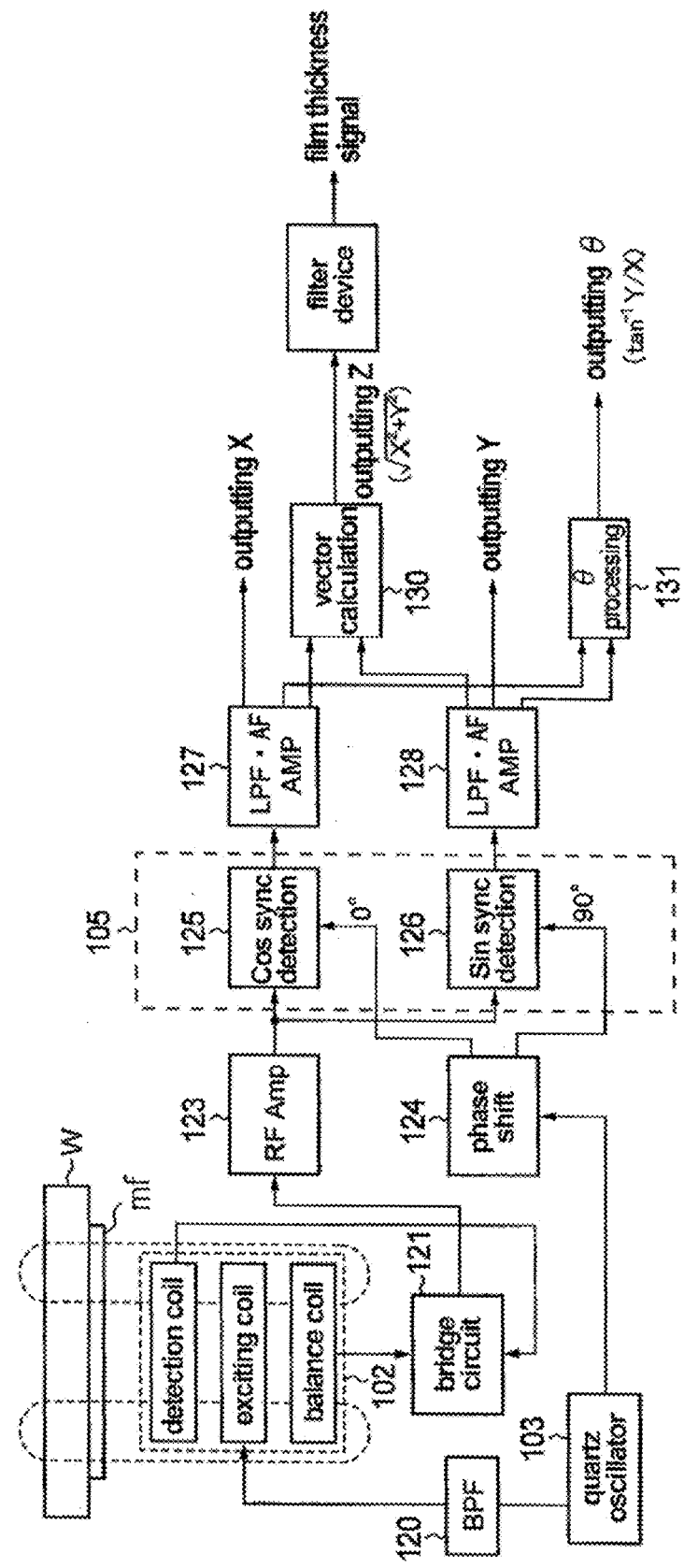
FIG. 10 is a schematic view showing a detailed structure of the eddy current sensor.

FIG. 10 is a schematic view showing a detailed structure of the eddy current sensor 50. The AC power supply 103 includes an oscillator, such as a quartz oscillator, generating a fixed frequency. For example, the AC power supply 103 supplies an alternating current having a fixed frequency of 1 to 50 MHz to the sensor coil 102. The alternating current generated by the AC power supply 103 is supplied to the sensor coil 102 via a bandpass filter 120. A terminal of the sensor coil 102 outputs a signal, which is sent to the synchronous detector 105 via a bridge circuit 121 and a high-frequency amplifier 123. The synchronous detector 105 includes a cosine synchronous detection circuit 125 and a sine synchronous detection circuit 126. A phase shift circuit 124 generates two signals, i.e., in-phase component (0 degree) and quadrature component (90 degrees), from an oscillation signal generated by the AC power source 103. These two signals are sent to the cosine synchronous detection circuit 125 and the sine synchronous detection circuit 126, respectively. The synchronous detector 105 extracts the resistance component and the inductive reactance component of the impedance.

Low-pass filters 127 and 128 remove unwanted high-frequency components (e.g., 5 kHz or more) from the resistance component and the inductive reactance component outputted from the synchronous detector 105. As a result, a signal X as the resistance component and a signal Y as the inductive reactance component of the impedance are outputted from the eddy current sensor 50. Further, a vector arithmetic circuit 130 obtains an impedance Z $[Z=(X^2+Y^2)^{1/2}]$ from the signal X and the signal Y. Further, a $\theta$ processing circuit 131 obtains a phase output $\theta$ $[\theta=\tan^{-1}Y/X)]$ from the signal X and the signal Y.

The impedance Z outputted from the vector arithmetic circuit 130 is the above-described film thickness signal that varies according to the film thickness. The above-described filtering device 35 is coupled to the vector arithmetic circuit 130, and removes the vibration component, having a preset frequency, from the film thickness signal outputted from the vector arithmetic circuit 130.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A polishing apparatus comprising:
   a polishing table for supporting a polishing pad;
   a table motor configured to rotate the polishing table;
   a top ring configured to press a substrate against the polishing pad to polish the substrate;

a dresser configured to dress the polishing pad while oscillating on the polishing pad during polishing of the substrate;
a filtering device configured to obtain an output current signal which indicates an electric current flowing into the table motor when the table motor is rotating the polishing table and to remove a vibration component, having a frequency corresponding to an oscillation period of the dresser, from the output current signal of the table motor; and
a polishing monitoring device configured to monitor a progress of polishing of the substrate based on the output current signal from which the vibration component has been removed.

2. The polishing apparatus according to claim 1, wherein the filtering device is configured to calculate the frequency corresponding to the oscillation period of the dresser.

3. The polishing apparatus according to claim 2, further comprising:
an operation controller configured to control an operation of the dresser,
wherein the filtering device is configured to obtain the oscillation period of the dresser from the operation controller and to calculate the frequency corresponding to the oscillation period of the dresser.

4. A polishing apparatus comprising:
a polishing table for supporting a polishing pad;
a table motor configured to rotate the polishing table;
a top ring configured to oscillate while pressing a substrate against the polishing pad;
a filtering device configured to obtain an output current signal which indicates an electric current flowing into the table motor when the table motor is rotating the polishing table and to remove a vibration component, having a frequency corresponding to an oscillation period of the top ring, from an output current signal of the table motor; and
a polishing monitoring device configured to monitor a progress of polishing of the substrate based on the output current signal from which the vibration component has been removed.

5. The polishing apparatus according to claim 4, wherein the filtering device is configured to calculate the frequency corresponding to the oscillation period of the top ring.

6. The polishing apparatus according to claim 5, further comprising:
an operation controller configured to control an operation of the top ring,
wherein the filtering device is configured to obtain the oscillation period of the top ring from the operation controller and to calculate the frequency corresponding to the oscillation period of the top ring.

7. A polishing apparatus comprising:
a polishing table for supporting a polishing pad;
a table motor configured to rotate the polishing table;
a top ring configured to press a substrate against the polishing pad to polish the substrate;
an eddy current sensor configured to scan a surface of the substrate to obtain a film thickness signal that varies according to a film thickness of the substrate;
a filtering device configured to remove a vibration component, having a predetermined frequency, from the film thickness signal, the predetermined frequency being inputted in advance into the filtering device; and
a polishing monitoring device configured to monitor a progress of polishing of the substrate based on the film thickness signal from which the vibration component has been removed.

8. The polishing apparatus according to claim 7, wherein the frequency is predetermined in advance based on at least a device structure of the substrate and a rotational speed of the polishing table.

9. A polishing method comprising:
rotating a polishing table by a table motor;
pressing a substrate against a polishing pad on the polishing table to polish the substrate;
oscillating a dresser on the polishing pad to dress the polishing pad during polishing of the substrate;
obtaining an output current signal which indicates an electric current flowing into the table motor when the table motor is rotating the polishing table
removing a vibration component, having a frequency corresponding to an oscillation period of the dresser, from the output current signal of the table motor; and
monitoring a progress of polishing of the substrate based on the output current signal from which the vibration component has been removed.

10. The polishing method according to claim 9, further comprising:
calculating the frequency corresponding to the oscillation period of the dresser.

11. The polishing method according to claim 10, further comprising:
obtaining the oscillation period of the dresser from an operation controller which controls an operation of the dresser.

12. A polishing method comprising:
rotating a polishing table by a table motor;
oscillating a top ring while the top ring is pressing a substrate against a polishing pad on the polishing table;
obtaining an output current signal which indicates an electric current flowing into the table motor when the table motor is rotating the polishing table;
removing a vibration component, having a frequency corresponding to an oscillation period of the top ring, from the output current signal of the table motor; and
monitoring a progress of polishing of the substrate based on the output current signal from which the vibration component has been removed.

13. The polishing method according to claim 12, further comprising:
calculating the frequency corresponding to the oscillation period of the top ring.

14. The polishing method according to claim 13, further comprising:
obtaining the oscillation period of the dresser from an operation controller which controls an operation of the dresser.

15. A polishing method comprising:
rotating a polishing table by a table motor;
pressing a substrate against a polishing pad on the polishing table to polish the substrate;
scanning a surface of the substrate with an eddy current sensor to obtain a film thickness signal that varies according to a film thickness of the substrate;
removing a vibration component, having a predetermined frequency, from the film thickness signal; and
monitoring a progress of polishing of the substrate based on the film thickness signal from which the vibration component has been removed.

16. The polishing apparatus according to claim 15, wherein the frequency is predetermined in advance based on at least a device structure of the substrate and a rotational speed of the polishing table.

* * * * *